United States Patent
Sashida et al.

(10) Patent No.: US 9,837,597 B2
(45) Date of Patent: Dec. 5, 2017

(54) PIEZOELECTRIC SOUND-GENERATING BODY AND ELECTRONIC DEVICE USING THE SAME

(71) Applicant: TAIYO YUDEN CO., LTD., Taito-ku, Tokyo (JP)

(72) Inventors: Norikazu Sashida, Takasaki (JP); Shigeo Ishii, Takasaki (JP); Yoshiyuki Watanabe, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 671 days.

(21) Appl. No.: 14/360,283

(22) PCT Filed: Dec. 18, 2012

(86) PCT No.: PCT/JP2012/082740
§ 371 (c)(1),
(2) Date: May 22, 2014

(87) PCT Pub. No.: WO2013/094583
PCT Pub. Date: Jun. 27, 2013

(65) Prior Publication Data
US 2014/0319968 A1   Oct. 30, 2014

(30) Foreign Application Priority Data

Dec. 20, 2011 (JP) .................. 2011-278536
Dec. 11, 2012 (JP) .................. 2012-270854

(51) Int. Cl.
*H01L 41/083*   (2006.01)
*H01L 41/047*   (2006.01)
(Continued)

(52) U.S. Cl.
CPC ........ *H01L 41/083* (2013.01); *H01L 41/0926* (2013.01); *H04R 17/00* (2013.01); *H04R 7/10* (2013.01); *H04R 2499/11* (2013.01)

(58) Field of Classification Search
CPC .... H01L 41/083; H01L 41/0926; H04R 17/00
(Continued)

(56) References Cited

U.S. PATENT DOCUMENTS 4,649,313 A * 3/1987 Ogawa ............... H01L 41/0926
                                                    310/328
5,828,160 A * 10/1998 Sugishita ............ H01L 41/107
                                                    310/359

(Continued)

FOREIGN PATENT DOCUMENTS

CN   101099410 A   1/2008
CN   201319667 Y   9/2009
(Continued)

OTHER PUBLICATIONS

International Search Report (ISR) dated Jan. 29, 2013, issued for International Application No. PCT/JP2012/082740.
(Continued)

*Primary Examiner* — Thomas Dougherty
(74) *Attorney, Agent, or Firm* — Law Office of Katsuhiro Arai

(57) ABSTRACT

A piezoelectric drive element includes piezoelectric layers, electrode layers between the piezoelectric layers, and electrode layers as the surfaces of the laminated layers. The piezoelectric layers are arranged on the upper side and on the lower side with reference to the center in the thickness direction, and are polarized in opposite directions. The thicknesses of piezoelectric layers at the center which have the least displacement are the thickest. The thicknesses of the piezoelectric layers above and under the thickest piezo-
(Continued)

electric layers decrease gradually in an outward direction. A piezoelectric sound-generating body is constructed by affixing the piezoelectric driving element to a support plate and supporting the piezoelectric driving element with a frame.

15 Claims, 5 Drawing Sheets

(51) Int. Cl.
*H04R 17/00* (2006.01)
*H01L 41/09* (2006.01)
*H04R 7/10* (2006.01)

(58) Field of Classification Search
USPC .................................................. 310/311–371
See application file for complete search history.

(56) References Cited

U.S. PATENT DOCUMENTS

| | | | | |
|---|---|---|---|---|
| 5,892,416 | A * | 4/1999 | Unami | H03H 9/1014 310/311 |
| 6,050,144 | A * | 4/2000 | Otsuchi | G01P 21/00 73/1.38 |
| 7,402,143 | B2 * | 7/2008 | Berger | A61B 5/0011 600/595 |
| 8,324,784 | B2 * | 12/2012 | Engel | H01L 41/083 310/311 |
| 2002/0079786 | A1 * | 6/2002 | Funaki | H03H 9/178 310/320 |
| 2005/0168108 | A1 * | 8/2005 | Face | H01H 13/7006 310/330 |
| 2007/0182594 | A1 * | 8/2007 | Face | H03K 17/951 341/20 |
| 2010/0007243 | A1 * | 1/2010 | Engel | H01L 41/083 310/322 |
| 2012/0212100 | A1 * | 8/2012 | Lee | H01L 41/053 310/317 |

FOREIGN PATENT DOCUMENTS

| | | | |
|---|---|---|---|
| JP | S61-103397 A | | 5/1986 |
| JP | 2003-259488 A | | 9/2003 |
| JP | 2006-287480 A | * 10/2006 | ............ H04R 17/00 |
| JP | 2010-517282 A | | 5/2010 |
| JP | 2011-155126 A | | 8/2011 |

OTHER PUBLICATIONS

Notification of Transmittal of Translation of the International Preliminary Report on Patentability (PCT/IB/338) dated Jul. 3, 2014, with International Preliminary Report on Patentability (PCT/IB/373) and Written Opinion of the International Searching Authority (PCT/ISA/237), for corresponding international application PCT/JP2012/082740.

A Notification of Reasons for Refusal issued by the Japanese Patent Office, dated Sep. 16, 2014, for Japanese counterpart application No. 2012-270854.

A First Notification of Reason for Refusal issued by the State Intellectual Property Office of China, dated Mar. 29, 2016, for Chinese counterpart application No. 201280057750.1.

* cited by examiner

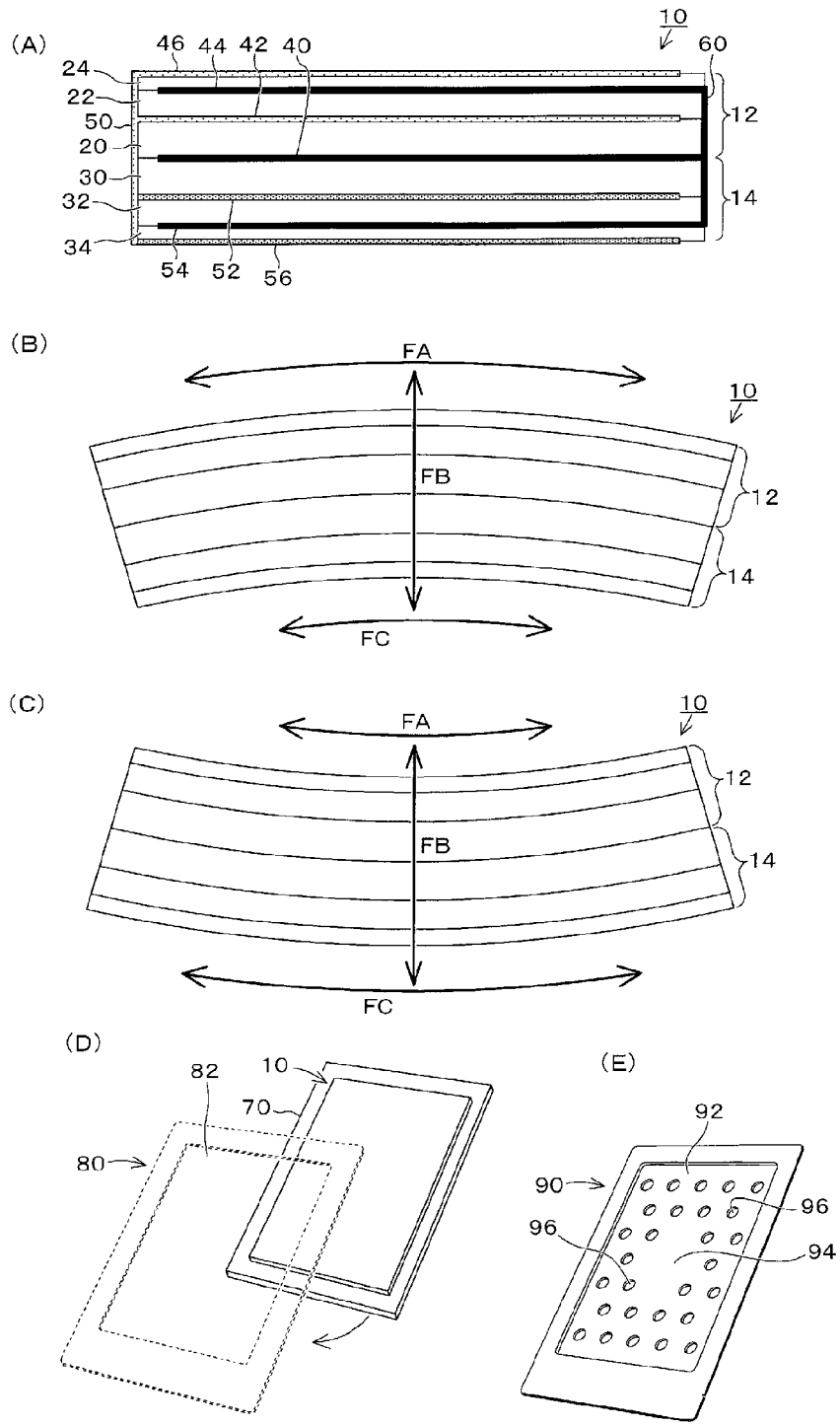

[Fig. 2]
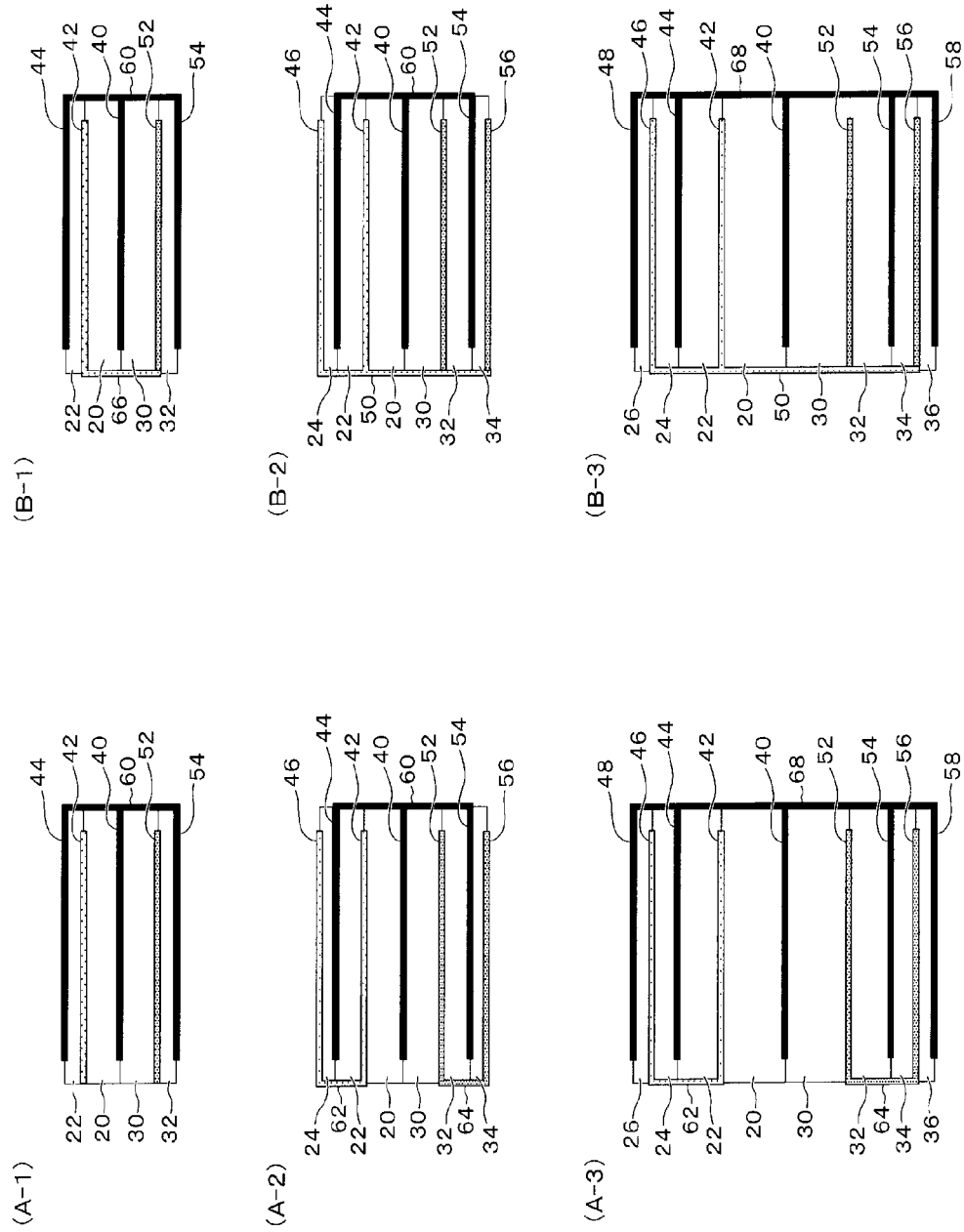

[Fig. 3]
(A)          (B)          (C)
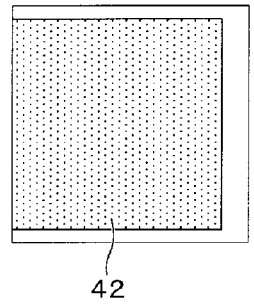  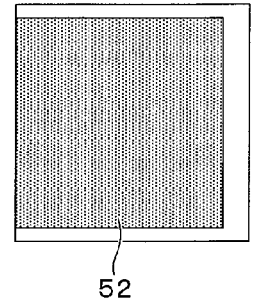  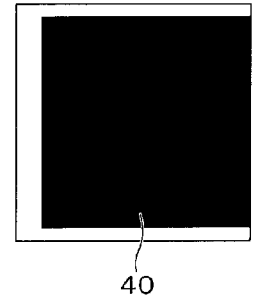
42           52           40

[Fig. 4]
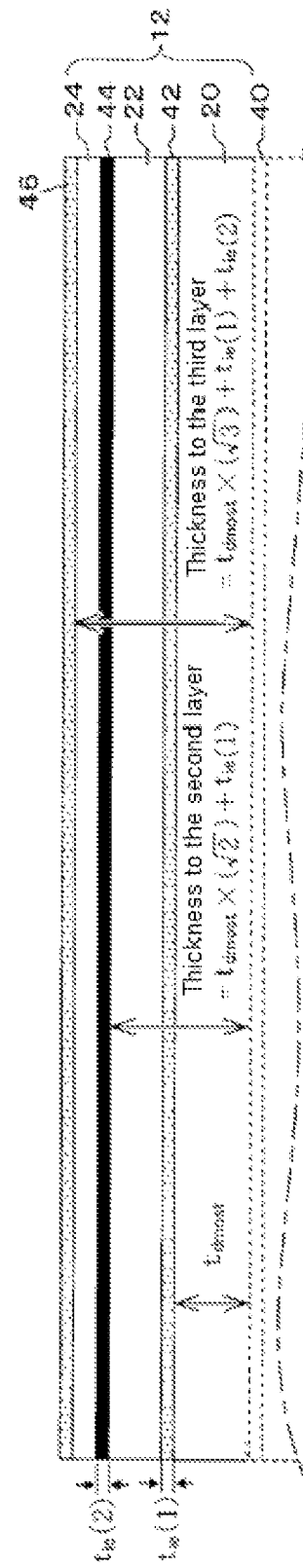

[Fig. 5]
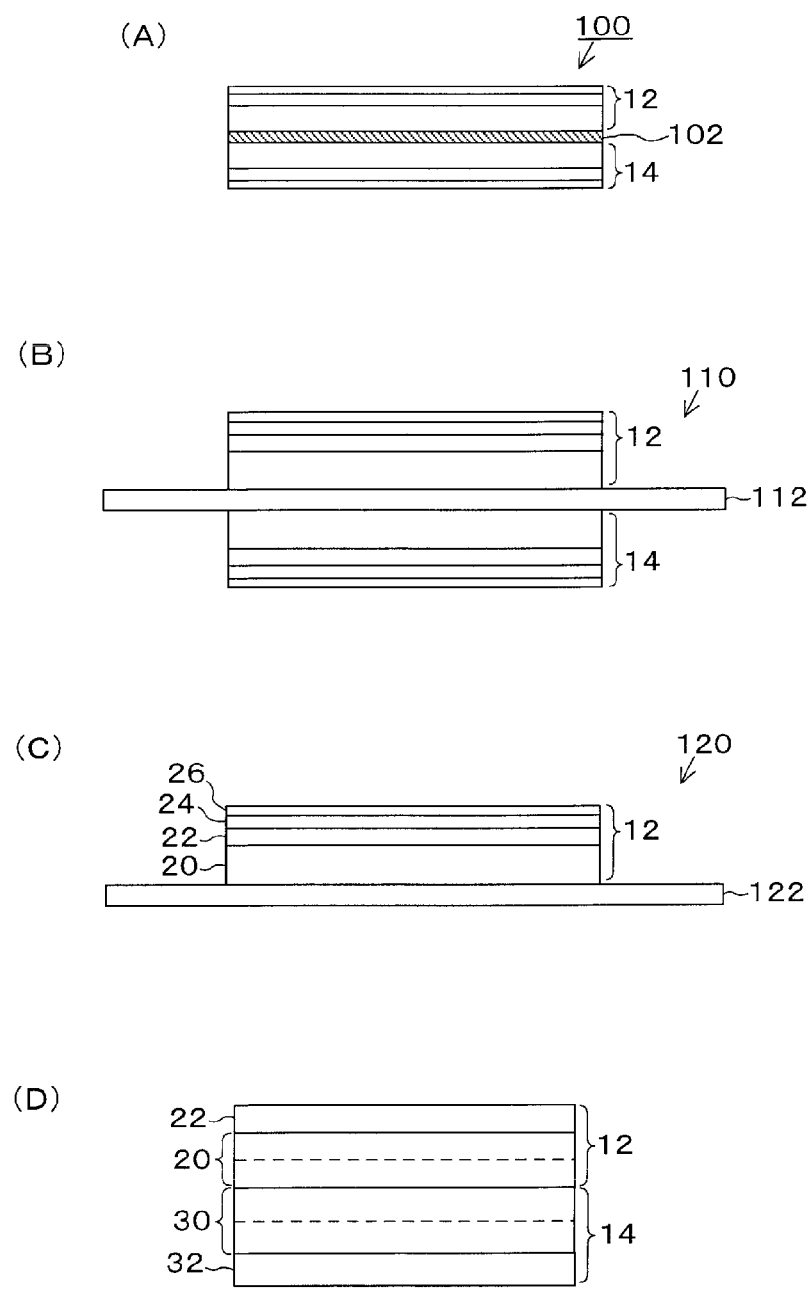

PIEZOELECTRIC SOUND-GENERATING BODY AND ELECTRONIC DEVICE USING THE SAME

This application is the U.S. National Phase under 35 U.S.C. §371 of International Application PCT/JP2012/082740, filed Dec. 18, 2012, which claims priority to Japanese Patent Applications No. 2011-278536, filed Dec. 20, 2011 and No. 2012-270854, filed Dec. 11, 2012. The International Application was published under PCT Article 21(2) in a language other than English.

TECHNICAL FIELD

The present invention relates to a piezoelectric sound-generating body and electronic device using the same, and more specifically to improving a piezoelectric sound-generating body in a manner suitable for installation in small devices, etc.

BACKGROUND ART

Mobile phones, smartphones, etc., are offering not only telephone functions but also more functions as personal digital assistants in recent years. In terms of the size of devices, there is a strong demand for smaller, thinner and lighter devices, which in turn is generating a greater demand for smaller, thinner and lighter components used for such devices. Speakers are facing the same demand, and piezoelectric speakers that utilize the expanding/contracting displacement of piezoelectric elements in 31 directions to provide enhanced displacement amplification based on flexural displacement are used in mobile devices as they can easily be made thinner while ensuring high sound pressures. In addition, piezoelectric speakers are suitable components of mobile devices for which battery life is important, because these voltage-driven speakers consume less power than dynamic speakers.

These piezoelectric speakers are formed by a laminate comprising up to eight layers or so to particularly reduce the driving voltage, which speakers are attached to a metal plate or other shim plate. Here, a piezoelectric speaker constituted by only one laminate piezoelectric body attached to a metal plate is called the unimorph type, while a piezoelectric speaker constituted by laminate piezoelectric bodies polarized in opposite directions, each attached on either side of a metal plate, is called the bimorph type. These unimorph and bimorph piezoelectric speakers are based on the technology described in Patent Literature 1 below, for example. A bimorph piezoelectric speaker may be achieved with only one element, without using a metal plate, by polarizing the top half and bottom half of a laminate piezoelectric element in opposite directions. This one-piece bimorph element offers relatively high efficiency in terms of flexural displacement because it has no extra structure such as a metal plate.

PRIOR ART LITERATURE

Patent Literature

Japanese patent Laid-open No. 2003-259488

SUMMARY OF THE INVENTION

Problems to be Solved by the Invention

Piezoelectric speakers are capacitive elements that, from the viewpoint of effective power consumption, consume much less power than dynamic speakers as mentioned above and thus allow batteries to last longer. However, their current increases at certain frequencies, especially around 10 to 20 kHz near the upper end of the audible spectrum, as the impedance drops. Despite low effective power consumption, such increase in current gives rise to a problem of heat generating in areas subject to higher resistance, such as where conductive wires constituting the speaker are connected. Generated heat accelerates the deterioration of piezoelectric elements, potentially causing their characteristics to deteriorate before the design life is reached. Also, thick conductive wires, etc., must be used to accommodate large current that may flow in the speaker driving circuit, which in turn presents a problem in that mobile devices, etc., cannot be made smaller.

The present invention focuses on the points made above and its object is to provide a piezoelectric sound-generating body whose current is kept low without affecting the amount of displacement of the element, thus preventing deterioration characteristics and allowing for size reduction. Another object is to provide an electronic device utilizing the aforementioned piezoelectric sound-generating body.

Means for Solving the Problems

A piezoelectric sound-generating body conforming to the present invention uses a piezoelectric driving element constituted by a laminate of multiple piezoelectric layers, wherein such piezoelectric sound-generating body is characterized in that: an electrode layer is formed between the multiple piezoelectric layers; the piezoelectric layer in the area associated with the smallest displacement of the piezoelectric driving element is the thickest; and the other piezoelectric layers become gradually thinner in the lamination direction from the thickest piezoelectric layer.

Another piezoelectric sound-generating body conforming to the present invention comprises a support plate supporting a bimorph piezoelectric driving element constituted by a laminate of four or more piezoelectric layers of an even number contributing to displacement, wherein such piezoelectric sound-generating body is characterized in that: an electrode layer is formed between the multiple piezoelectric layers; piezoelectric layers of the same number above and below the center in the lamination direction are polarized in the opposite directions; the piezoelectric layers become gradually thinner upward and downward in the lamination direction from the center; and the piezoelectric layers at the same position in the laminate above and below the center, being the base point, have the same thickness.

Yet another piezoelectric sound-generating body is a unimorph type made by attaching to one main side of a support plate a piezoelectric driving element constituted by a laminate of two or more piezoelectric layers contributing to displacement, wherein such piezoelectric sound-generating body is characterized in that: an electrode layer is formed between the multiple piezoelectric layers; and the piezoelectric layers become gradually thinner in the lamination direction from the piezoelectric layer on the support plate side.

An electronic device conforming to the present invention is characterized in that it utilizes any one of the piezoelectric sound-generating bodies mentioned above. The aforementioned and other objects, characteristics and benefits of the present invention are made clear by the detailed explanations provided below as well as the drawings attached hereto.

Effects of the Invention

According to the present invention, a piezoelectric sound-generating body using a piezoelectric driving element constituted by a laminate of multiple piezoelectric layers is formed in such a way that the piezoelectric layer in the area associated with the smallest displacement is the thickest and the other piezoelectric layers become gradually thinner toward the outer side. This way, the capacity can be reduced and current can be kept low without affecting the amount of displacement of the element. As a result, failures due to heat generation can be prevented, while size reduction also becomes possible because there is no longer a need to use thick conductive wires for the driving circuit.

BRIEF DESCRIPTION OF THE DRAWINGS

FIG. 1 Drawings illustrating Example 1 of the present invention, where (A) is a section view showing the laminate structure of a piezoelectric driving element, (B) and (C) are each a section view showing the piezoelectric driving element in flexed state, while (D) and (E) are each a drawing showing an example of a frame to support the piezoelectric driving element.

FIG. 2 Drawings illustrating the formation of electrode layers of a bimorph piezoelectric driving element constituted by a laminate of four to eight layers, where (A-1) through (A-3) show an electrode formation at the time of polarization operation, while (B-1) through (B-3) show an electrode formation at the time of driving.

FIG. 3 Plan views each showing an internal electrode pattern of a piezoelectric driving element conforming to the present invention.

FIG. 4 Drawing explaining the definition of the thickness of piezoelectric driving element that takes into account the thickness of internal electrode layers.

FIG. 5 Drawings illustrating other examples of the present invention.

MODES FOR CARRYING OUT THE INVENTION

Example 1

The best modes for carrying out the present invention are explained in detail below based on examples. FIG. 1 (A) is a section view showing the laminate structure of a piezoelectric driving element, (B) and (C) are each a section view showing the piezoelectric driving element in flexed state, while (D) and (E) are each a drawing showing an example of a frame to support the piezoelectric driving element. FIG. 2 provides drawings illustrating the formation of electrode layers of a bimorph piezoelectric driving element constituted by a laminate of four to eight layers, where (A-1) through (A-3) show an electrode formation at the time of polarization operation, while (B-1) through (B-3) show an electrode formation at the time of driving. FIG. 3 provides plan views each showing an internal electrode pattern of a piezoelectric driving element conforming to the present invention. FIG. 4 is a drawing explaining the definition of the thickness of piezoelectric driving element that takes into account the thickness of internal electrode layers. A piezoelectric sound-generating body 10 in this example is utilized, for example, as a speaker for personal digital assistants, representative forms of which include mobile phones and smartphones.

As shown in FIG. 1 (A) and (D), the piezoelectric driving element 10 used for the piezoelectric sound-generating body in this example is a bimorph type whose overall shape is roughly a rectangle. The piezoelectric driving element 10 is constituted by six piezoelectric layers 20, 22, 24, 30, 32, 34, electrode layers 40, 42, 44, 52, 54 provided in between these piezoelectric layers, and electrode layers 46, 56 formed on the laminate surface. In this example, three piezoelectric layers are formed above and also below the electrode layer 40 at the center in the thickness direction. The piezoelectric layers 20, 22 and 24 form a top laminate piezoelectric body 12, while the piezoelectric layers 30, 32 and 34 form a bottom laminate piezoelectric body 14.

In this example, the piezoelectric layers 20, 30 in the areas associated with the smallest displacement (smallest expansion and contraction in the lateral direction) of the piezoelectric driving element 10 are formed the thickest. Then, the piezoelectric layers 20, 22 and 24 become gradually thinner in this order, while the piezoelectric layers 30, 32 and 34 also become gradually thinner in this order. The piezoelectric layers 20 and 30 have the same thickness, piezoelectric layers 22 and 32 have the same thickness, and piezoelectric layers 24 and 34 have the same thickness. In other words, the thickness of each piezoelectric layer is set in such a way to achieve a vertically symmetrical layer structure and thicknesses with reference to the electrode layer 40 used as the plane of symmetry. This means that, when adopting the bimorph structure as is the case in this example, there are always four or more piezoelectric layers (piezoelectric layers contributing to displacement) of an even number that constitute the piezoelectric driving element. The thickness ratios of piezoelectric layers are explained in detail later.

The piezoelectric driving element 10 can be produced with a normal method comprising forming PZT or other piezoelectric sheets, printing a paste containing electrodes on the sheets and stacking/pressure-bonding the printed sheets, and then sintering the stacked/pressure-bonded sheets at a specified temperature. The element dimensions in planar directions are not specified in any way, but a circle of approx. 20 to 25 mm in diameter or rectangle of approx. 15 to 20 mm per side is desired when use of the element for normal mobile devices is assumed. In this example, the element is rectangular. In the example of FIG. 1 (A), the piezoelectric layer 34, electrode layer 54, piezoelectric layer 32, electrode layer 52, piezoelectric layer 30, electrode layer 40, piezoelectric layer 20, electrode layer 42, piezoelectric layer 22, electrode layer 44, and piezoelectric layer 24 are stacked in this order from the bottom. The outermost electrode layers 46, 56 may be formed by printing a paste and sintering it simultaneously with the laminate, just as the internal electrode layers are formed, or by applying and baking a paste after the laminate has been sintered. Alternatively, they may be formed by deposition, sputtering, plating, or other low-temperature process.

Next, the piezoelectric layers 20 through 24, 30 through 34 of the laminate thus formed are impressed with polarization voltage using the electrode layers 40 through 46, 52 through 56, and polarized as specified. For instance, in the example shown in FIG. 2 (A-2), the electrode layers 42 and 46 are connected by a side electrode 62 as a positive electrode pattern, while the electrode layers 52 and 56 are connected by a side electrode 64 as a negative electrode pattern. Additionally, the electrode layers 40, 44 and 54 are connected by a side electrode 60 as a common pattern. Examples of these positive electrode pattern, negative electrode pattern, and common pattern are shown in FIG. 3 (A) through (C). The side electrodes 60, 62, 64 are formed, for example, by a method of applying a paste on the side face of the laminate or by a method that employs deposition, sputtering, plating, or other low-temperature process. Or, instead of connecting the electrode layers via their exterior side faces, it is possible to use the through hole method of making holes in the piezoelectric sheets and interconnecting the electrode layers when the paste is printed, or any other conventional method, to connect the electrode layers.

When the piezoelectric driving element 10 has a four-layer structure, on the other hand, the electrode layer 42 provides a positive electrode pattern, while the electrode layer 52 provides a negative electrode pattern, as shown in FIG. 2 (A-1). In addition, the electrode layers 40, 44 and 54 are connected by the side electrode 60 as a common pattern. When the piezoelectric driving element 10 has an eight-layer structure, the electrode layers 42 and 46 are connected by the side electrode 62 as a positive electrode pattern, while the electrode layers 52 and 56 are connected by the side electrode 64 as a negative electrode pattern, as shown in FIG. 2 (A-3). Additionally, the electrode layers 40, 44, 48, 54, and 58 are connected by a side electrode 68 as a common pattern.

Sintering of the laminate and formation of the electrodes are followed by polarization. A voltage equal to or greater than the coercive electric field of the material is applied as the polarization voltage, but the voltage applied must be appropriate for the thickest layer. Also, the temperature may be raised to lower the voltage at the time of polarization. Polarization is implemented based on three poles associated with positive voltage, negative voltage, and common voltage of 0 V, respectively, using the positive electrode pattern, negative electrode pattern, and common pattern, as shown in FIG. 2 (A-1) through (A-3). At this time, the positive voltage and negative voltage must be the same and applied simultaneously. If the voltages are different or not applied simultaneously, the element may deform abnormally and crack due to stress. When the polarization is complete, the positive electrode and negative electrode are connected as one electrode, as shown in FIG. 2 (B-1) through (B-3). In the example of the four-layer structure shown in FIG. 2 (B-1), the electrode layers 42 and 52 are connected by a side electrode 66. In the example of the six-layer structure shown in FIG. 2 (B-2) and example of the eight-layer structure shown in FIG. 2 (B-3), the electrode layers 42, 46, 52, and 56 are connected by a side electrode 50.

Then, signals are input to these connected electrodes and common electrode to cause the top half and bottom half of the piezoelectric driving element 10 to expand and contract in opposite directions, thereby producing flexural displacement. In the example of the six-layer structure in FIG. 1 (A), the polarization direction of the piezoelectric layers 30, 32, 34 constituting the bottom laminate piezoelectric body 14 is opposite the polarization direction of the piezoelectric layers 20, 22, 24 constituting the top laminate piezoelectric body 12. On the other hand, audio signals and other driving voltages are applied to the electrode layers 42, 46, 52, and 56, while the remaining electrode layers 40, 44, 54 are connected to ground. Accordingly, the laminate piezoelectric body 12 expands and contracts in the direction of arrow FA opposite to the direction of arrow FC in which the laminate piezoelectric body 14 expands and contracts. In other words, the laminate piezoelectric body 14 contracts in the direction of arrow FC when the piezoelectric body 12 expands in the direction of arrow FA, as shown in FIG. 1 (B). On the other hand, the laminate piezoelectric body 14 expands in the direction of arrow FC when the piezoelectric body 12 contracts in the direction of arrow FA, as shown in FIG. 1 (C). As a result, the entire element vibrates in the direction of arrow FB.

The overall thickness of the piezoelectric driving element 10 is 50 to 200 μm. If the thickness is smaller than this range, insufficient strength is produced to overcome air or the rigidity of a support plate 70 described layer, thus preventing the element from displacing fully. If the thickness is greater than this range, on the other hand, the piezoelectric driving element 10 cannot also displace fully, due to excessive rigidity of the element itself. While the example in FIG. 1 (A) shows six piezoelectric layers, any even number of layers greater than four is acceptable and the four-layer structure shown in FIGS. 2 (A-1) and (B-1) or eight-layer structure shown in FIGS. 2 (A-3) and (B-3) may be adopted. In any event, the layers are stacked symmetrically above and below the center in the thickness direction (electrode layer 40 in this example).

The thickness ratios of multiple piezoelectric layers can be given by Equation 1 below when flexural displacement is assumed and the total number of layers is given by 2n (n is a natural number) from the amount of expansion/contraction required of each layer as calculated from the radius of curvature:

$$\sqrt{n}-\sqrt{n-1}; \sqrt{n-1}-\sqrt{n-2}; \ldots \sqrt{2}-\sqrt{1}:1:$$
$$1:\sqrt{2}-\sqrt{1}; \sqrt{3}-\sqrt{2}; \ldots \sqrt{n-1}-\sqrt{n-2}; \sqrt{n}-\sqrt{n-1}$$ [Equation 1]

When Equation 1 above is used, the thickness ratios of piezoelectric bodies are $\sqrt{2}-1:1:1:\sqrt{2}-1$ from the bottom layer when there are four layers (n=2). They are $\sqrt{3}-\sqrt{2}:\sqrt{2}-1:1:1:\sqrt{2}-1:\sqrt{3}-\sqrt{2}$ when there are six layers (n=3), and $2-\sqrt{3}:\sqrt{3}-\sqrt{2}:\sqrt{2}-1:1:1:\sqrt{2}-1:\sqrt{3}-\sqrt{2}:2-\sqrt{3}$ when there are eight layers (n=4). Note that an acceptable margin of error for the thickness of each layer is up to ±10% of the above ratio. It has been shown that, when the thicknesses of respective layers having these ideal thickness ratios are added up, the total layer thickness is expressed by the relationship of $2 \times t_{dmost} \times (\sqrt{n})$, where $t_{dmost}$ indicates the thickness of the thickest piezoelectric layer among the piezoelectric layers contributing to displacement and the number of piezoelectric layers contributing to displacement is given by 2n. In other words, when the thickness of the thickest piezoelectric layer among the piezoelectric layers contributing to displacement is given by $t_{dmost}$, the thickness from the base point to the nth layer (n is a natural number) satisfies $t_{dmost} \times (\sqrt{n})$, where the base point represents the boundary surface between the thickest piezoelectric layer and the center electrode layer. Since the piezoelectric driving element in this example is of the bimorph structure, the piezoelectric layer thickness of the element as a whole is twice that, or specifically $2 \times t_{dmost} \times (\sqrt{n})$ as mentioned above.

However, the actual laminate must have an electrode layer formed between layers. These electrodes must be formed simultaneously as the ceramics (piezoelectric layers) are sintered, and therefore use silver, platinum, palladium, or alloy thereof that does not melt but is only sintered at the sintering temperature of the ceramics. Unlike the piezoelectric layers, the electrode layers do not deform under voltage and thus Equation 1 above is modified according to the presence of electrode layers. Given this inhibition of the amount of displacement of the piezoelectric driving element 10 according to the presence of electrode layers, the electrode layers should be as thin as possible, such as 1 to 2 μm when the printing method is used. In addition, having more layers means a higher electrode ratio, so the practical number of piezoelectric layers to be stacked is no more than eight. Also, at least four layers are required because if there are only two layers, there is no gradient or difference in layer thickness.

Equation 1 above can be modified to account for greater overall thickness and higher bending rigidity by giving the thickness of this electrode layer by $t_{ie}$, thickness of the thickest piezoelectric layer by $t_{dmost}$, and ratio A of the thickness of this electrode layer to the thickness of the thickest piezoelectric layer by $(t_{ie}/t_{dmost})$ but such modified equation cannot be solved analytically. When the Young's modulus of the electrode material is assumed as 50 to 150 GPa, overall thickness of the piezoelectric driving element 10 is assumed as 50 to 200 μm, and maximum electrode thickness is assumed as 5 μm; however, the equation can be calculated approximately. When there are four piezoelectric layers, optimum characteristics can be achieved by adjusting the thicknesses of piezoelectric layers 32, 30, 20, and 22 to the ratios given by Equation 2 below:

$$\sqrt{2}-1-A:1-4A:1-4A:\sqrt{2}-1-A \quad [\text{Equation 2}]$$

Similarly, when there are six piezoelectric layers, the thickness ratios of piezoelectric layers 34, 32, 30, 20, 22, and 24 that provide optimum characteristics are given by Equation 3 below:

$$\sqrt{3}-\sqrt{2}-A:\sqrt{2}-1-2A:1-4A:1-4A:\sqrt{2}-1-2A:\sqrt{3}-\sqrt{2}-A \quad [\text{Equation 3}]$$

Furthermore, when there are eight piezoelectric layers, the thickness ratios of piezoelectric layers 36, 34, 32, 30, 20, 22, 24, and 26 that provide optimum characteristics are given by Equation 4 below:

$$2-\sqrt{3}-\frac{A}{4}: \quad [\text{Equation 4}]$$
$$\sqrt{3}-\sqrt{2}-\frac{A}{2}:\sqrt{2}-1-\frac{3}{2}A:1-4A:1-4A:\sqrt{2}-1-\frac{3}{2}A:\sqrt{3}-\sqrt{2}-\frac{A}{2}:2-\sqrt{3}-\frac{A}{4}$$

The effects of the present invention can be demonstrated so long as the margin of error of the thickness of each piezoelectric layer is within ±10%. Since this example applies to the bimorph type, however, each layer on the outer side must be thinner than other layer present on the inner side of it. If this condition is not met, the element capacity will increase and driving current will rise, thereby preventing the desired effects from manifesting.

It has been shown that, when the electrode layer thickness is also considered, as mentioned above, the thickness from the base point to the nth layer is expressed by the relationship of $t_{dmost} \times (\sqrt{n}) + \Sigma t_{ie}(n-1)$, where $t_{dmost}$ represents the thickness of the thickest piezoelectric layer among the piezoelectric layers contributing to displacement and the base point represents the boundary surface between the thickest piezoelectric layer and the center electrode layer.

This is explained in concrete terms by referring to FIG. 4. FIG. 4 shows the top laminate piezoelectric body 12 side of the piezoelectric driving element 10. The piezoelectric layer 20 contacting the center electrode layer 40 contributes most to displacement. In this example, the thickness from the base point (boundary surface between the piezoelectric layer 20 and electrode layer 40) to the first piezoelectric layer is $t_{dmost}$ when the above equation of $t_{dmost}(\sqrt{n})$ is applied. Next, the thickness to the second layer (n=2) is $t_{dmost} \times (\sqrt{2}) + t_{ie}(1)$, which corresponds to $t_{dmost} \times (\sqrt{2})$ plus the thickness $t_{ie}(1)$ of the electrode layer 42. Furthermore, the thickness to the third layer (n=3) is $t_{dmost} \times (\sqrt{3}) + t_{ie}(1) t_{ie}(2)$, after adding the thickness of the second electrode layer 44. In other words, because the (n−1) number of electrode layers are present in between the n number of piezoelectric layers, the thickness from the aforementioned base point to the nth layer can be expressed by $t_{dmost} \times (\sqrt{n}) + \Sigma t_{ie}(n-1)$ by adding up their thicknesses.

As shown in FIG. 1 (D), the aforementioned piezoelectric driving element 10 is attached to the support plate 70. The softest possible material is used for the support plate 70. For example, rubber and urethane are suitable. The thickness of the support plate 70 is in a range of 50 to 200 μm similar to that of the piezoelectric driving element 10. If the thickness of the plate is smaller than this range, the element cannot be supported fully and may be damaged as it vibrates; if the thickness of the plate is greater than this range, on the other hand, vibration of the element is inhibited and the sound pressure will drop. The support plate 70 to which the piezoelectric driving element 10 has been attached is then attached to a frame made of metal, plastic, etc., and the electrodes are connected to a terminal strip, etc., to obtain a piezoelectric sound-generating body. Here, lead wires, etc., may be used or conductive paste or other material that hardens under heat may be used.

The aforementioned frame may be a simple frame shape with an opening 82 like a frame 80 shown in FIG. 1 (D), or it may be shaped as a lid. However, a sufficient clearance must be provided between the top of the lid on one hand and the element and vibration plate on the other to prevent contact due to vibration. For example, a frame 90 shown in FIG. 1 (E) is of the lid type mentioned above, having a sufficient space 92 not to inhibit the element from vibrating as well as multiple sound-emitting holes 96 provided in a bottom surface 94 of the lid. The piezoelectric sound-generating body thus obtained has 50 to 60% lower current than a piezoelectric sound-generating body constituted by a simple laminate of piezoelectric bodies of an identical thickness, while the sound pressure is the same, and consequently heat generation at connection points can be suppressed and use of small, low-cost drive circuit components becomes possible.

Table 1 below lists the sound pressure (average of sound pressures at 800, 1000, 1500, and 2000 Hz) and current in driven state of each speaker produced in this method. The elements tested were 14×18 mm in size, each attached to the support plate 70 using a 100 μm thick elastomer and to the lid-shaped metal frame 90 as shown in FIG. 1 (E). Examples 1 through 4 based on different numbers of layers and layer formations were produced and tested. As Comparative Examples 1 through 6, speakers were produced in the same manner using elements whose layer thickness formation was outside the scope of the present invention, and tested in the same way, the results of which are shown in Table 1.

TABLE 1

|   | Number of layers | Layer formation (μm) | Electrode layer thickness (μm) | Element thickness (μm) | Average sound pressure level (dB) | Current when 10 kHz sine wave is input (mA) |
|---|---|---|---|---|---|---|
| Example 1 | 4 | 12:24:24:12 | 2 | 72 | 97.0 | 220 |
| Comparative Example 1 | 4 | 18:18:18:18 | 2 | 72 | 96.9 | 380 |
| Comparative Example 2 | 4 | 8:28:28:8 | 2 | 72 | 96.8 | 420 |

TABLE 1-continued

| | Number of layers | Layer formation (μm) | Electrode layer thickness (μm) | Element thickness (μm) | Average sound pressure level (dB) | Current when 10 kHz sine wave is input (mA) |
|---|---|---|---|---|---|---|
| Example 2 | 4 | 16:32:32:16 | 3 | 96 | 96.9 | 280 |
| Comparative Example 3 | 4 | 24:24:24:24 | 3 | 96 | 96.7 | 490 |
| Comparative Example 4 | 4 | 12:36:36:12 | 3 | 96 | 97.0 | 540 |
| Example 3 | 6 | 11:12:31:31:12:11 | 2 | 108 | 97.0 | 600 |
| Comparative Example 5 | 6 | 18:18:18:18:18:18 | 2 | 102 | 96.8 | 820 |
| Example 4 | 8 | 15:17:20:48:48:20:17:15 | 2 | 200 | 96.8 | 860 |
| Comparative Example 6 | 8 | 25:25:25:25:25:25:25:25 | 2 | 200 | 96.9 | 1240 |

As is evident from the results of Examples 1 through 4 and Comparative Examples 1 through 6 in Table 1, the elements within the scope of the present invention had sufficiently small current, while those outside the scope of the present invention had large current and could not achieve desired effects.

As explained, Example 1 involves a piezoelectric sound-generating body using a bimorph piezoelectric driving element 10 constituted by a laminate of multiple piezoelectric layers, where the piezoelectric layer at the center where the amount of displacement is the smallest is made the thickest. It also has the same number of layers above and below the center in the thickness direction and a vertically symmetrical layer structure, and its piezoelectric layers become gradually thinner from the center toward the outer side. This way, the capacity can be reduced and current can be kept low even when high frequency signals are input, without affecting the amount of displacement of the element. As a result, failures due to heat generation can be prevented, while size reduction also becomes possible because there is no longer a need to use thick conductive wires for the driving circuit.

<Variation Example 1> . . . Next, Variation Example 1 of this example is explained by referring to FIG. 5 (A). While the piezoelectric driving element 10 shown in FIG. 1 (A) has its top laminate piezoelectric body 12 and bottom laminate piezoelectric body 14 formed with the electrode layer 40 sandwiched in between, a piezoelectric driving element 100 shown in FIG. 5 (A) has its laminate piezoelectric bodies 12, 14 formed symmetrically with an inactive layer (non-polarizing layer) 102 other than an electrode layer sandwiched in between. In this case, too, effects similar to those described in the aforementioned example can be achieved.

<Variation Example 2> . . . Next, Variation Example 2 of this example is explained by referring to FIG. 5 (B). While the piezoelectric driving element 10 shown in FIG. 1 (A) is of the bimorph type not using any shim plate, a constitution where laminate piezoelectric bodies 12, 14 are attached at the top and bottom of a metal plate or other shim plate 112 may also be adopted, as is the case of a piezoelectric driving element 110 shown in FIG. 5 (B). In this case, a piezoelectric sound-generating body can be constituted by supporting the shim plate 112 with the frame 80 or 90 shown in FIG. 1 (D) or FIG. 1 (E) to achieve effects similar to those described in Example 1.

Example 2

Next, Example 2 of the present invention is explained by referring to FIG. 5 (C). While the piezoelectric driving element in Example 1 is of the bimorph type, the present invention can also be applied to the unimorph type. A piezoelectric driving element 120 shown in FIG. 5 (C) is constituted by the laminate piezoelectric body 12 of four-layer structure attached to one main side of a vibration plate 122 made of metal material. The foregoing is then attached to the aforementioned frame 80 or 90 to constitute a piezoelectric sound-generating body. With the unimorph type like the one shown in this example, the piezoelectric layer undergoing the smallest displacement (area undergoing the smallest expansion and contraction in the lateral direction), or specifically the piezoelectric layer 20 on the vibration plate 122 side, is the thickest and the piezoelectric layers 22, 24, and 26 become gradually thinner toward the upper side in the lamination direction.

It suffices that there are at least two piezoelectric layers, but if there are n number of layers (n is a natural number), for example, ideally the thickness ratios of piezoelectric layers correspond to the ratios given by Equation 5 below from the vibration plate 122 side toward the upper layers. Needless to say, a margin of error of up to ±10% is allowed for the ratio of each piezoelectric layer, as is the case in Example 1 above. To apply Equation 5 below, the vibration plate 122 to be used is one whose Young's modulus is 50 to 200 GPa and thickness is one half or less that of the laminate piezoelectric body 12.

$$1{:}\sqrt{2}-\sqrt{1}{:}\sqrt{3}-\sqrt{2}{:}\ldots\sqrt{n-1}-\sqrt{n-2}{:}\sqrt{n}-\sqrt{n-1} \quad \text{[Equation 5]}$$

Furthermore, desirably the total layer thickness is specified as $t_{dmost} \times (\sqrt{n})$ where $t_{dmost}$ represents the thickness of the thickest piezoelectric layer among the piezoelectric layers contributing to displacement and n represents the number of piezoelectric layers contributing to displacement.

In addition, Equation 5 above can be modified according to the presence of electrode layers in between piezoelectric layers by defining the ratio A of the thickness of the electrode layer ($t_{ie}$) to the thickness of the thickest piezoelectric layer ($t_{dmost}$) as $A=(t_{ie}/t_{dmost})$, as is the case in Example 1 above. For example, the equation can be calculated approximately by assuming the Young's modulus of the electrode material to be 50 to 150 GPa, total thickness of the piezoelectric driving element 120 to be 50 to 200 μm, and maximum electrode thickness to be 5 μm. When there are two piezoelectric layers, optimal characteristics can be achieved by adjusting the thicknesses of piezoelectric layers 20, 22 to the ratios given by Equation 6 below:

$$1-4A{:}\sqrt{2}-1-A \quad \text{[Equation 6]}$$

Similarly, when there are three piezoelectric layers, the thickness ratios of piezoelectric layers 20, 22, 24 that provide optimal characteristics are given by Equation 7 below:

$$1-4A{:}\sqrt{2}-1-2A{:}\sqrt{3}-\sqrt{2}-A \quad \text{[Equation 7]}$$

Furthermore, when there are four piezoelectric layers, the thickness ratios of piezoelectric layers 20, 22, 24, 26 that provide optimal characteristics are given by Equation 8 below:

$$4A : \sqrt{2} - 1 - \frac{3}{2}A : \sqrt{3} - \sqrt{2} - \frac{A}{2} : 2 - \sqrt{3} - \frac{A}{4} \quad \text{[Equation 8]}$$

The effects of the present invention can be demonstrated so long as the margin of error of the thickness of each piezoelectric layer is within ±10%. Since this example applies to the bimorph type, however, each layer on the outer side must be thinner than the piezoelectric layer 20 present on the vibration plate 122 side of it. If this condition is not met, the element capacity will increase and driving current will rise, thereby preventing the desired effects from manifesting. So long as the foregoing is met, effects similar to those described in Example 1 can be achieved even when the unimorph type is used as in this example. When the thickness of the electrode layer is considered, the thickness from the base point (boundary surface between the vibration plate 122 and piezoelectric layer 20 in this example) to the nth layer is expressed by $t_{dmost} \times (\sqrt{n}) + \Sigma t_{ie}(n-1)$ as described above in Example 1.

The present invention is not limited to the aforementioned examples in any way, and various changes can be added to the extent that doing so does not deviate from the key points of the present invention. For example, the following are also permitted as included in the scope of the present invention: (1) The shape of the piezoelectric driving element as shown in the above examples is an example and it can be changed to a circle, etc., as deemed appropriate if necessary. (2) The dimensions of the piezoelectric driving element in planar directions as shown in the above examples are also an example and the design can be changed as deemed appropriate if necessary. (3) The material shown in the above examples is also an example and any of various known materials can be used. (4) The mechanism to support the piezoelectric driving element using the support plate 70 and frame 80 or 90 as shown in Example 1 above is also an example and the design can be changed as deemed appropriate to the extent that similar effects are achieved. (5) The lamination method of the piezoelectric driving element as shown in Example 1 above is also an example and it can be changed as deemed appropriate if necessary. In the case of a bimorph type of four-layer structure whose piezoelectric layers 20, on the center side are roughly twice as thick as the piezoelectric layers 22, 32 on the outer side, two of the piezoelectric sheets used as the piezoelectric layer 22 or 32 are stacked on top of each other to form the piezoelectric layer 20 or 30, as shown in FIG. 5 (D). Manufacturing becomes easy when the thickness of each piezoelectric layer can be aligned by adjusting the number of sheets to be stacked. (6) While the examples above were explained based on a speaker to be installed in a mobile phone, etc., the present invention can be applied as a piezoelectric sound-generating body used for any of various known electronic devices such as a receiver for mobile phones.

INDUSTRIAL FIELD OF APPLICATION

According to the present invention, a piezoelectric sound-generating body using a piezoelectric driving element constituted by a laminate of multiple piezoelectric layers is formed in such a way that the piezoelectric layer in the area associated with the smallest displacement is the thickest and the piezoelectric layers become gradually thinner toward the outer side. This way, the capacity can be reduced and current can be kept low without affecting the amount of displacement of the element, and as this prevents failures and allows for size reduction, the present invention can be applied to a piezoelectric sound-generating body installed in electronic devices, etc. In particular, the present invention is suitable for mobile electronic devices, etc., representative examples of which include mobile phones and smartphones.

DESCRIPTION OF THE SYMBOLS

10: Piezoelectric driving element, 12, 14: Laminate piezoelectric body, 20 to 26, 30 to 36: Piezoelectric layer, 40 to 46, 52 to 58: Electrode layer, 50, 60 to 68: Side electrode, 70: Support plate, 80, 90: Frame, 82: Opening, 92: Space, 94: Bottom surface, 96: Sound emitting hole, 100: Piezoelectric driving element, 102: Inactive layer, 110: Piezoelectric driving element, 112: Shim plate (support plate), 120: Piezoelectric driving element, 122: Vibration plate

What is claimed is:

1. A piezoelectric sound-generating body using a piezoelectric driving element constituted by a laminate of multiple piezoelectric layers, wherein:
    an electrode layer is formed between the respective piezoelectric layers, wherein the piezoelectric layers and electrode layers extend in a longitudinal direction of the piezoelectric driving element, and the displacement is defined along the longitudinal direction;
    the piezoelectric layer in an area associated with a smallest displacement of the piezoelectric driving element is a thickest among the piezoelectric layers; and
    other piezoelectric layers have thickness becoming thinner layer by layer-consecutively in a lamination direction from the thickest piezoelectric layer, all the piezoelectric layers being connected to two shared side electrodes which are all side electrodes provided in the piezoelectric driving element,
    wherein the other piezoelectric layers are provided above and below the thickest piezoelectric layer and polarized in opposite directions so as to produce flexural displacement when driving current is applied to the side electrodes.

2. A piezoelectric sound-generating body comprising a support plate supporting a bimorph piezoelectric driving element constituted by two sets of piezoelectric layers constituting a laminate of four or more piezoelectric layers of an even number contributing to displacement, wherein:
    an electrode layer is formed between the respective piezoelectric layers, wherein the piezoelectric layers and electrode layers extend in a longitudinal direction of the piezoelectric driving element, and the displacement is defined along the longitudinal direction;
    the two sets of piezoelectric layers, each set having a same number of piezoelectric layers disposed above and below a center boundary along a lamination direction, are polarized in opposite directions so as to produce flexural displacement when driving current is applied to the side electrodes;
    the piezoelectric layers in the two sets have thickness becoming thinner layer by layer consecutively upward and downward in the lamination direction from the center boundary, respectively; and the piezoelectric layers in the two sets at a same position in the laminate above and below the center boundary as a reference point have a same thickness, all the piezoelectric layers in each set being connected to two shared side electrodes which are all side electrodes provided in the piezoelectric driving element.

3. A piezoelectric sound-generating body according to claim 2, wherein, when a thickness of the thickest piezoelectric layer among the piezoelectric layers contributing to displacement is given by $t_{dmost}$, a thickness from the reference point to an nth layer (n is a natural number) satisfies $t_{dmost} \times (\sqrt{n})$, where the reference point represents a center boundary-side surface of the thickest piezoelectric layer.

4. A piezoelectric sound-generating body according to claim 3, wherein, when the thickness of the thickest piezoelectric layer among the piezoelectric layers contributing to displacement is given by tamest and a number of piezoelectric layers contributing to displacement is given by 2n, a total layer thickness satisfies $2 \times t_{dmost} \times (\sqrt{n})$.

5. A piezoelectric sound-generating body according to claim 2, wherein, when the thickness of the thickest piezoelectric layer among the piezoelectric layers contributing to displacement is given by $t_{dmost}$ and a thickness of an nth electrode layer (n is a natural number) from the center boundary is given by $t_{ie}(n)$, a thickness from the base point to the nth layer satisfies $t_{dmost} \times (\sqrt{n}) + \Sigma t_{ie}(n-1)$, where the base point represents a center boundary-side surface of the thickest piezoelectric layer.

6. A piezoelectric sound-generating body being a unimorph type wherein a piezoelectric driving element constituted by a single set of piezoelectric layers constituting a laminate of two or more piezoelectric layers contributing to displacement is polarized in a single direction and attached to only one of main sides of a support plate, wherein:
an electrode layer is formed between the respective piezoelectric layers, wherein the piezoelectric layers and electrode layers extend in a longitudinal direction of the piezoelectric driving element, and the displacement is defined along the longitudinal direction; and
the piezoelectric layers have thickness becoming thinner layer by layer consecutively in a lamination direction from the piezoelectric layer facing the support plate, all the piezoelectric layers being connected to two shared side electrodes which are all side electrodes provided in the piezoelectric driving element, so as to produce flexural displacement when driving current is applied to the side electrodes.

7. A piezoelectric sound-generating body according to claim 6, wherein: the support plate is a vibration plate made of metal material; and, when a thickness of the thickest piezoelectric layer among piezoelectric layers contributing to displacement is given by $t_{dmost}$, a thickness from a reference point to an nth layer (n is a natural number) satisfies $t_{dmost} \times (\sqrt{n})$, where the reference point represents a surface of the thickest piezoelectric layer facing the support plate.

8. A piezoelectric sound-generating body according to claim 6, wherein: the support plate is a vibration plate made of metal material; and, when a thickness of the thickest piezoelectric layer among piezoelectric layers contributing to displacement is given by $t_{dmost}$ and a thickness of an nth electrode layer (n is a natural number) from the reference point is given by $t_{ie}(n)$, a thickness from the reference point to the nth layer satisfies $t_{dmost} \times (\sqrt{n}) + \Sigma t_{ie}(n-1)$, where the reference point represents a surface of the thickest piezoelectric layer facing the support plate.

9. A piezoelectric sound-generating body according to claim 3, wherein a margin of error up to ±10% relative to the calculated value of the equation is allowed for the thickness of each of the piezoelectric layers.

10. An electronic device characterized by utilizing a piezoelectric sound-generating body according to claim 1.

11. A piezoelectric sound-generating body according to claim 5, wherein a margin of error up to ±10% relative to the calculated value of the equation is allowed for the thickness of each of the piezoelectric layers.

12. A piezoelectric sound-generating body according to claim 7, wherein a margin of error up to ±10% relative to the calculated value of the equation is allowed for the thickness of each of the piezoelectric layers.

13. A piezoelectric sound-generating body according to claim 8, wherein a margin of error up to ±10% relative to the calculated value of the equation is allowed for the thickness of each of the piezoelectric layers.

14. An electronic device characterized by utilizing a piezoelectric sound-generating body according to claim 2.

15. An electronic device characterized by utilizing a piezoelectric sound-generating body according to claim 6.

* * * * *